US006920596B2

(12) United States Patent
Sagatelian et al.

(10) Patent No.: US 6,920,596 B2
(45) Date of Patent: Jul. 19, 2005

(54) METHOD AND APPARATUS FOR DETERMINING FAULT SOURCES FOR DEVICE FAILURES

(75) Inventors: Arman Sagatelian, Sunnyvale, CA (US); Alvin Jee, Sunnyvale, CA (US); Julie Segal, Palo Alto, CA (US); Yervant D. Lepejian, Palo Alto, CA (US); John M. Caywood, Sunnyvale, CA (US)

(73) Assignee: Heuristics Physics Laboratories, Inc., San Jose, CA (US)

( * ) Notice: Subject to any disclaimer, the term of this patent is extended or adjusted under 35 U.S.C. 154(b) by 531 days.

(21) Appl. No.: 10/055,088

(22) Filed: Jan. 22, 2002

(65) Prior Publication Data

US 2003/0140294 A1 Jul. 24, 2003

(51) Int. Cl.$^7$ .............................................. G01R 31/28
(52) U.S. Cl. ....................................... 714/732; 714/737
(58) Field of Search ................................ 714/732–737

(56) References Cited

U.S. PATENT DOCUMENTS

| 4,503,536 A | * | 3/1985 | Panzer ........................ 714/732 |
| 5,475,695 A | | 12/1995 | Caywood et al. .............. 371/27 |
| 5,727,000 A | * | 3/1998 | Pizzica ........................ 714/737 |
| 5,930,270 A | * | 7/1999 | Forlenza et al. ............. 714/736 |
| 6,557,132 B2 | * | 4/2003 | Gangl et al. ................. 714/736 |

OTHER PUBLICATIONS

"Early Error Detection in Systems–on–Chip for Fault–Tolerance and At–Speed Debugging" by Sogomonyan et al. 19th IEEE Proceedings on VLSI Test Symposium Publication Date: Apr. 29–May 3, 2001 pp. 184–189 Inspec Accession No.: 7023720.*

"Efficient Implementation of Multiple On–Chip Signature Checking" Abdulla et al. 10th International Conference on VLSI Design Publication Date: Jan. 4–7, 1997 pp. 297–302 Inspec Accession No.: 5565767.*

"Predicting Failing Bitmap Signatures for Memory Arrays with Critical Area Analysis" Segal et al. Advanced Semiconductor Manufacturing Conference and Workshop, 1999 IEEE/SEMI Publication Date: Sep. 8–10, 1999 pp. 178–182 Inspec Accession No.: 6512794.*

K. Tobin, "Automated Analysis for Rapid Defect Sourcing and Yield Learning", *Future Fab International*, 15 pages, vol. 4, 1997, no month.

"Semiconductor Spatial Signature Analysis (SSA)", [Internet] http://www–ismv.ic.ornl.gov/projects/SSA.html, 6 pages, Revised Mar. 31, 1999, printed Feb. 27, 2003.

J. Segal et al., "The Value of Electrical Bitmap Results from Embedded Memory Arrays for Rapid Yield Learning", *Digest of Papers, 2$^{nd}$ IEEE Latin American Test Workshop LATW2001*, pp. 266–272, Feb. 2001.

* cited by examiner

*Primary Examiner*—Albert Decady
*Assistant Examiner*—Cynthia Britt
(74) *Attorney, Agent, or Firm*—Sierra Patent Group, Ltd.

(57) ABSTRACT

A method for determining fault sources for device failures comprises: generating failure signatures of fault sources for preselected tests; generating aggregate failure signatures for individual of the fault sources from the failure signatures; generating aggregate device test data from test data of a device for the preselected tests; generating aggregate matches by comparing the aggregate failure signatures with the aggregate device test data; and determining fault sources for device failures by comparing the test data of the device with ones of the failure signatures of fault sources corresponding to the aggregate matches. An apparatus configured to perform the method comprises at least one circuit.

11 Claims, 3 Drawing Sheets

METHOD AND APPARATUS FOR DETERMINING FAULT SOURCES FOR DEVICE FAILURES

FIELD OF THE INVENTION

The present invention generally relates to failure analysis techniques and in particular, to a method and apparatus for determining fault sources for device failures.

BACKGROUND OF THE INVENTION

As product life cycles shorten, rapid yield improvement becomes critical. In the area of semiconductor devices, for example, a major part of the yield improvement effort has traditionally involved failure analysis on devices that fail electrical test. Once fault sources for device failures are determined, the information is fed back to the fabrication facility for corrective action.

In order to determine such fault sources, however, a large amount of data often must be processed. When such data is analyzed manually, the task can be especially daunting. U.S. Pat. No. 5,475,695, entitled "Automatic Failure Analysis System," invented by John M. Caywood et al., and incorporated herein by this reference, describes an automatic failure analysis system for processing test data to identify failure causing defects.

Even in an automatic failure analysis system, however, it is useful to improve the computational efficiency for determining fault sources for device failures, because such improvement translates directly into accelerating the yield analysis and consequently, yield improvement curve. As a result, devices can be produced with higher yields sooner, thereby improving manufacturing throughput and reducing unit cost earlier in the product life cycle of the device.

OBJECTS AND SUMMARY OF THE INVENTION

Accordingly, an object of the present invention is a method for determining fault sources for device failures that is computationally efficient.

Another object is an apparatus for performing a method for determining fault sources for device failures that is computationally efficient.

These and additional objects are accomplished by the various aspects of the present invention, wherein briefly stated, one aspect is a method for determining fault sources for device failures, comprising: generating failure signatures of fault sources for preselected tests; generating aggregate failure signatures for individual of the fault sources from the failure signatures; generating aggregate device test data from test data of a device for the preselected tests; generating aggregate matches by comparing the aggregate failure signatures with the aggregate device test data; and determining fault sources for device failures by comparing the test data of the device with ones of the failure signatures of fault sources corresponding to the aggregate matches.

Another aspect is an apparatus for determining fault sources for device failures, comprising at least one circuit configured to: generate failure signatures of fault sources for preselected tests; generate aggregate failure signatures for individual of the fault sources from the failure signatures; generate aggregate device test data from test data of a device for the preselected tests; generate aggregate matches by comparing the aggregate failure signatures with the aggregate device test data; and determine fault sources for device failures by comparing the test data of the device with ones of the failure signatures of fault sources corresponding to the aggregate matches.

Another aspect is an apparatus for determining fault sources for device failures, comprising: means for generating failure signatures of fault sources for preselected tests; means for generating aggregate failure signatures for individual of the fault sources from the failure signatures; means for generating aggregate device test data from test data of a device for the preselected tests; means for generating aggregate matches by comparing the aggregate failure signatures with the aggregate device test data; and means for determining fault sources for device failures by comparing the test data of the device with ones of the failure signatures of fault sources corresponding to the aggregate matches.

Additional objects, features and advantages of the various aspects of the invention will become apparent from the following description of its preferred embodiments, which description should be taken in conjunction with the accompanying drawings.

DETAILED DESCRIPTION OF THE PREFERRED EMBODIMENT

Figure 1:
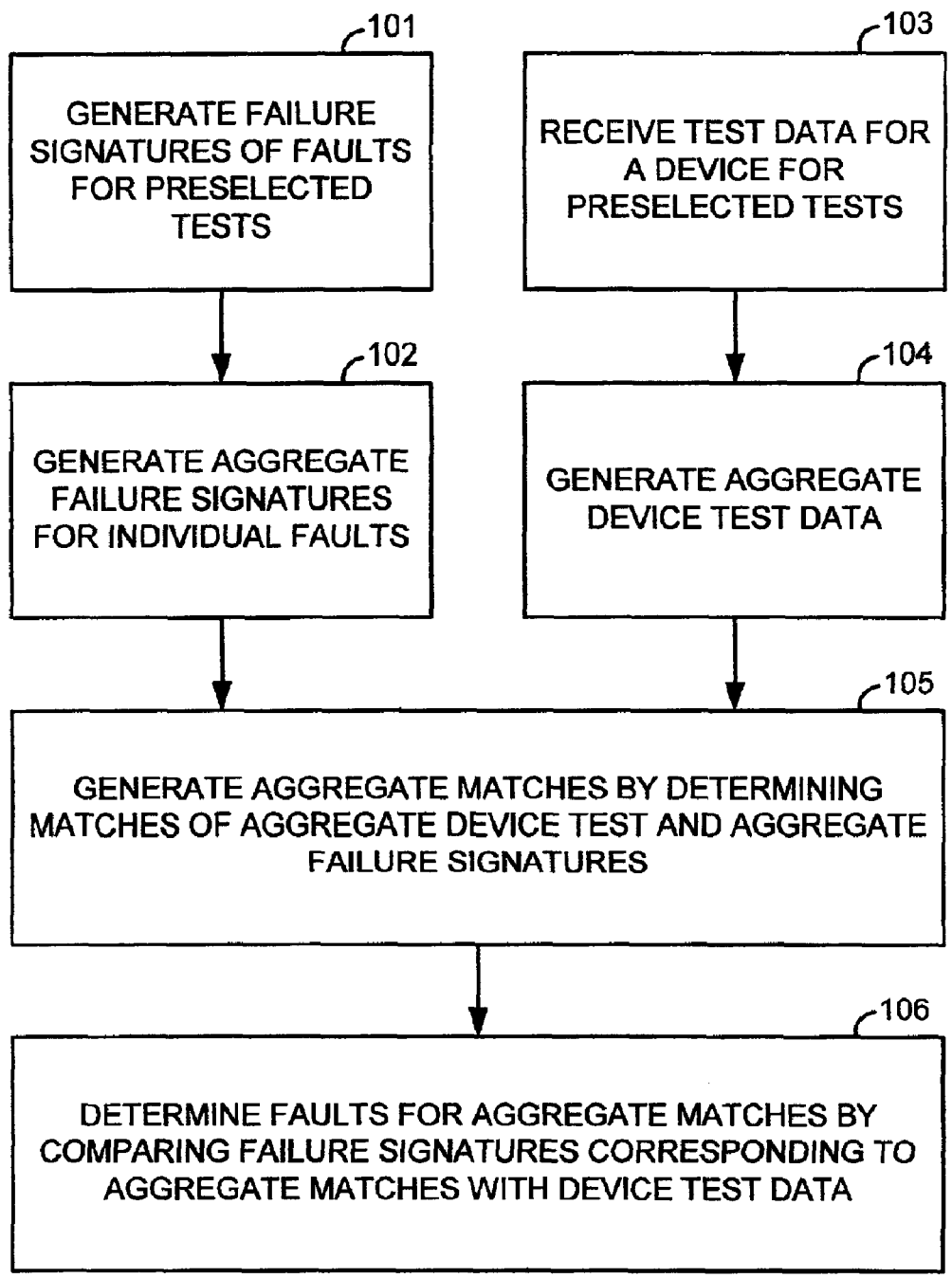
FIG. 1 illustrates, as an example, a method for determining fault sources for device failures, utilizing aspects of the present invention.

FIG. 1 illustrates a method for determining fault sources for device failures. A processor programmed to perform the method is the preferred implementation. In 101, failure signatures of fault sources are generated for preselected tests to be performed on units of a device. One method of doing this is to determine potential defect failures by analyzing the physical layout of the device using, for example, an expert system, and determine failure signatures corresponding to the potential defect failures using, for example, a knowledge database. As an example, the knowledge generation portion of the aforementioned U.S. Pat. No. 5,475,695, entitled "Automatic Failure Analysis System," describes a system useful for generating such failure signatures.

Examples of failure signatures for a memory device include: a column failure where a column of bits or cells fails throughout a block of bits; a column quad failure where four adjacent columns of bits fail; a row failure where a row of bits fails throughout a block; a column fragment failure where a fragment of a column of bits fails; a row fragment failure where a fragment of a row of bits fails; an even/odd bit pair in a column failure; an odd/even bit pair in a column failure; an even/odd bit pair in a row failure; an odd/even bit pair in a row failure; and a single bit failure where a single bit fails surrounded by good bits. Such examples are merely representative. There are many well-known failure signatures for memory devices that are not included above. For other types of devices, other failure signatures may also be generated.

In 102, aggregate failure signatures are generated from the failure signatures for individual of the fault sources. One method of doing this is to logically combine failure signatures corresponding to the preselected tests for individual of the fault sources, such as, for example, described in reference to file 31 of FIG. 3, where OR logic is used to logically combine or aggregate failure signatures corresponding to individual of the preselected tests for individual of the fault sources. Where the failure signatures are defined as bitmap patterns, such as with a memory or programmable logic array ("PLA") device, the bitmap patterns, particularly if they are of different size, are preferably centered with respect to each other before their aggregation.

In 103, test data is received that corresponds to the preselected tests having been performed on one or more units of a particular device of interest. In the case of an array type device such as a memory or PLA, the test data is commonly in the form of bitmaps indicating which cells or bits in the array have failed. In 104, aggregated test data is generated from the previously received test data. One method of doing this is to logically combine the test data, such as, for example, described in reference to file 33 of FIG. 3, where OR logic is used to logically combine or aggregate the device test data.

Since 101 and 102 only require device design data, they may be performed prior to actual fabrication of any units of the device of interest. In contrast, since 103 and 104 require actual device test data, they can only be performed after fabrication of units of the device. Therefore, 101 and 102 are described herein as being performed prior to 103 and 104. However, it is to be appreciated that such order is not restrictive. In certain applications, 101 and 102 may be performed after 103 and 104, and this alternative order is contemplated to also be included within the full scope of the appended claims.

In 105, aggregate matches are generated by comparing the aggregate failure signatures with the aggregate device test data. One method of doing this is to search the aggregate test data for the aggregate failure signatures. For array type devices where bitmap device test data and bitmap failure signature patterns are used, the aggregate bitmap failure signature patterns are "moved" through the aggregate bitmap device test data in much the same manner as conventional techniques wherein non-aggregated bitmap failure signature patterns are "moved" through non-aggregated bitmap device test data to detect instances of such non-aggregated bitmap failure signature patterns occurring in the non-aggregated bitmap device test data. In the present method, since aggregate test data and aggregate failure signatures are used, there is far less data to be compared than in the conventional techniques wherein non-aggregated bitmap failure signature patterns are "moved" through non-aggregated bitmap device test data, thus speeding up the fault source identification process.

In 106, fault sources for device failures are then determined by comparing the original test data with the failure signatures of fault sources corresponding to the aggregate matches. One way of doing this is to first determine the fault sources corresponding to the aggregate matches, then for individual of the fault sources, compare test data of the device for individual of the preselected tests against failure signatures of the fault sources for those individual of the preselected tests. Fault sources for device failures are then determined by finding matches through such comparing of the test data against the failure signatures.

Figure 2:
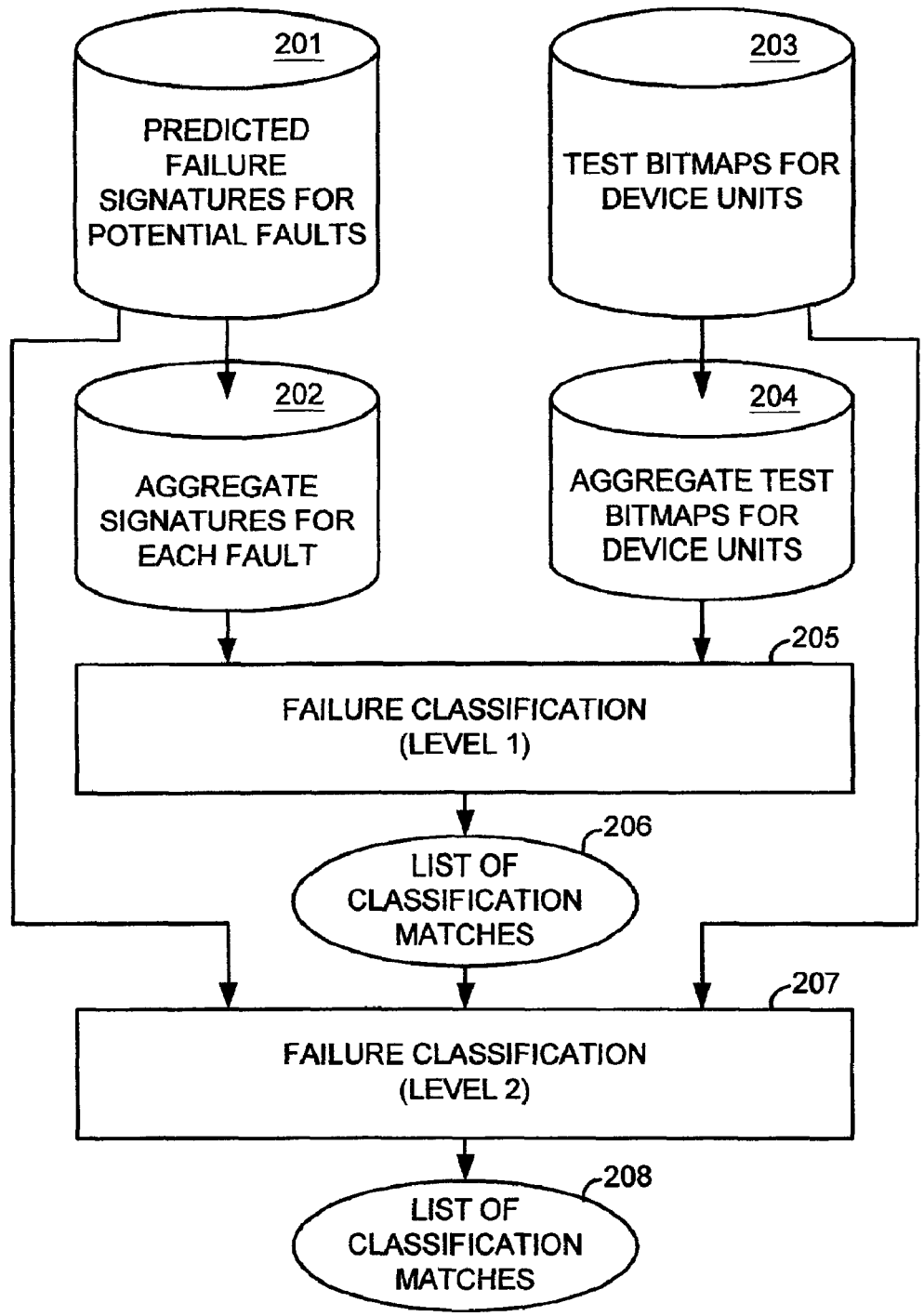
FIG. 2 illustrates, as an example, a data flow diagram of a method for determining fault sources for device failures, utilizing aspects of the present invention.

FIG. 2 illustrates, as an example, a data flow diagram of a method for determining fault sources for device failures. File 201 includes predicted failure signatures generated, for example, as described in reference to 101 in FIG. 1. In this example, each predicted failure signature is associated with a fault source (also referred to herein simply as a "fault") and a test to be performed on the device, such that when the fault is present in the device, the predicted failure signature occurs in the results of the test. File 202 includes aggregate failure signatures generated, for example, as described in reference to 102 of FIG. 1 from the predicted failure signatures of file 201. File 203 includes bitmaps conventionally generated from test data provided from a device tester for tested units of a device. Each bitmap in this example results from a test performed on one unit of the device. File 204 includes an aggregate bitmap generated, for example, as described in reference to 104 of FIG. 1 from the bitmaps in file 203. In this and other examples described herein, there is one such aggregate bitmap for individual unit of the device.

Figure 3:
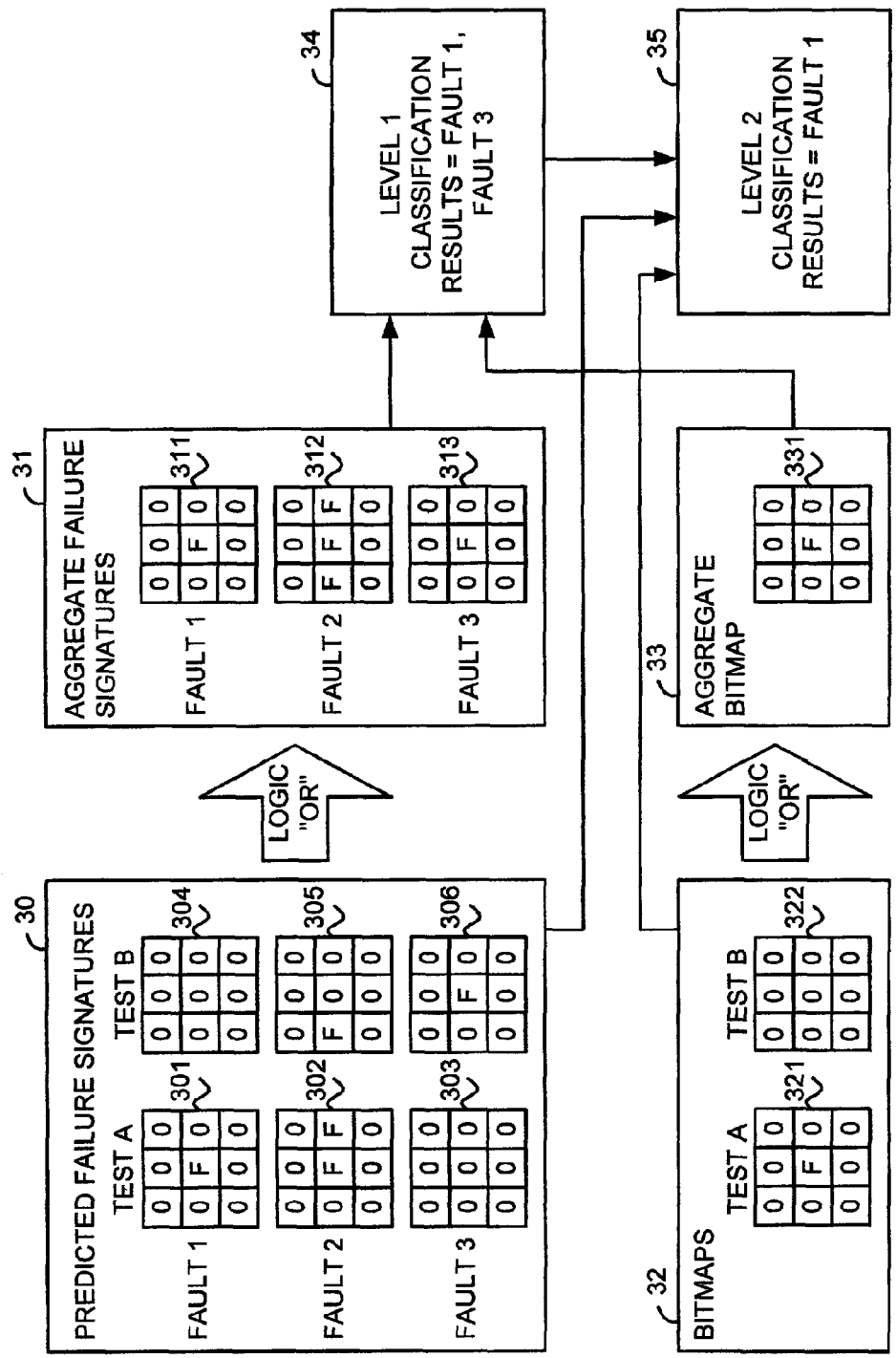
FIG. 3 illustrates, as an example, an application of a method for determining fault sources for device failures, utilizing aspects of the present invention.

A failure classification processor 205 reads the contents of files 202 and 204, generates aggregate matches, and determines fault sources corresponding to those aggregate matches as described, for example, in reference to list 34 in FIG. 3. This matching process is referred to as being level 1, because it is done at the aggregate level so as to provide a "coarse-tuned" list 206 of potential fault sources. A second failure classification processor 207 reads the "coarse-tuned" list 206 and the contents of files 201 and 203, and determines a "fine-tuned" list of potential fault sources for device failures, as described, for example, in reference to list 35 in FIG. 3. This matching process is referred to as being level 2, because it is done at the non-aggregate level to provide the "fine-tuned" list 208 from the "coarse-tuned" list 206. Where more than one potential fault source may be associated with an aggregate match in the "fine-tuned" list 208, information regarding their probabilities of occurrence are also preferably provided for or otherwise linked to the list 208.

FIG. 3 illustrates, as a simplified example, an application of a method for determining fault sources for device failures. File 30 includes predicted fault signatures 301~306, such as those described in reference to file 201 in FIG. 2. Although all of the predicted failure signatures are shown as being the same 3×3 bit or cell size, in practice, it is to be appreciated that they may be different sizes and also not necessarily of equal rows and columns. In the example, a "0" in a bit or cell location indicates that no failure is detected for that bit or cell, and conversely, an "F" in a bit or cell location indicates that a failure is detected for that bit or cell.

If fault 1 is present in the device being tested, then predicted fault signature 301 is expected to occur in the results of test A and predicted fault signature 304 is expected to occur in the results of test B. On the other hand, if fault 2 is present in the device being tested, then predicted fault signature 302 is expected to occur in the results of test A and predicted fault signature 305 is expected to occur in the results of test B. Finally, if fault 3 is present in the device being tested, then predicted fault signature 303 is expected to occur in the results of test A and predicted fault signature 306 is expected to occur in the results of test B.

It is noteworthy that sometimes a failure may not be detected in the results of a test, even though a fault source may be present in the device being tested. Predicted failure signatures 304 and 303 are representative of such occurrences. Therefore, it is useful to perform multiple tests on a device. Although only two tests, A and B, are shown in this simplified example, it is to be appreciated that in practice, many more tests are preferably performed on units of a device to assure detection of as many fault sources as commercially practical.

File 31 includes aggregate fault signatures 311~313, such as and exemplary of those described in reference to file 202 in FIG. 2. Aggregate fault signature 311 is generated by logically OR'ing fault signatures 301 and 304. Likewise, aggregate fault signature 312 is generated by logically OR'ing fault signatures 302 and 305 associated with fault 2, and aggregate fault signature 313 is generated by logically OR'ing fault signatures 303 and 306 associated with fault 3.

File 32 includes bitmaps 321 and 322 resulting respectively from tests A and B being performed on one unit of the device. Although bitmaps 321 and 322 are depicted as being the same size as the predicted failure signatures 301~306, in practice, it is to be appreciated that they are generally much larger. For example, for a large memory device, resulting device bitmaps may have rows and/or columns in the order of thousands. In such a case, bitmaps 321 and 322 may be considered 3x3 arrays that have the same respective coordinates in their respective larger bitmaps, wherein at least one of bitmaps 321 and 322 includes a failure signature whose fault source is to be determined.

File 33 includes an aggregate bitmap 331, such as and exemplary of those described in reference to file 204 in FIG. 2. Aggregate bitmap 331 is generated in this example by logically OR'ing bitmaps 321 and 322.

A "coarsely-tuned" or level 1 classification list 34 of potential fault sources includes fault 1 and fault 3, as determined, for example, by a processor such as described in reference to the failure classification processor 205 of FIG. 2. To generate the "coarsely-tuned" list 34, the processor compares each of the aggregate failure signatures 311~313 in turn, with the aggregate bitmap 331. Each time a match occurs between one of the aggregate failure signatures 311~313 and the aggregate bitmap 331, an aggregate match is noted. The processor then determines fault sources corresponding to the aggregate matches and adds them to the "coarsely-tuned" list 34. In particular in the present example, aggregate failure signatures 311 and 313 both match aggregate bitmap 331, so both aggregate failure signatures 311 and 313 are noted as aggregate matches and faults 1 and 3 respectively corresponding to aggregate failure signatures 311 and 313 are added to the "coarsely-tuned" list 34.

In the case where the aggregate bitmap 331 represents a portion of a much larger device bitmap, the processor "moves" each of the aggregate failure signatures 311~313 in turn, through the larger device bitmap in a conventional raster scan fashion, for example, from left to right and top to bottom. Each time a match occurs between one of the aggregate failure signatures 311~313 and an aggregate bitmap 331 representing a portion of the larger device bitmap, an aggregate match is noted and the processor determines the corresponding fault source and adds it to the "coarsely-tuned" list 34.

A "finely-tuned" or level 2 classification list 35 of potential fault sources includes only fault 1, as determined, for example, by a processor such as described in reference to the failure classification processor 207 of FIG. 2. To generate the "finely-tuned" list 35, the processor reads the fault sources included in the "coarsely-tuned" list 34, and compares the non-aggregate failure signatures associated with each of those fault sources against their test corresponding, non-aggregate bitmaps. When matches occur for all such comparisons for a fault source, that fault source is added to the "finely-tuned" list 35. When a match does not occur for any such comparison for a fault source, that fault source is omitted from the "finely-tuned" list 35.

In particular in the present example, the processor compares fault signature 301 (for fault 1, test A) against bitmap 321 (for test A) and determines that they match, and it compares fault signature 304 (for fault 1, test B) against bitmap 322 (for test B) and determines that they also match. Consequently, it adds fault 1 to the "finely-tuned" list 35. On the other hand, the processor compares fault signature 303 (for fault 3, test A) against bitmap 321 (for test A) and determines that they do not match, and it compares fault signature 306 (for fault 3, test B) against bitmap 322 (for test B) and determines that they also do not match. Consequently, it omits fault 3 from the "finely-tuned" list 35.

In the simplified example depicted in FIG. 3, the aggregate bitmap has been substantially simplified to include only one failure pattern for descriptive purposes. Also, the fault sources resulting in device failures have also been simplified so that only one fault source is identified as causing that one failure pattern. In practice, however, it is to be appreciated that a device test bitmap may include multiple failure patterns and the fault sources in the resulting "fine-tuned" list may include more than one fault source for each identifiable failure pattern in the device test bitmap. Regardless of such simplification in the example, however, it is readily appreciated that application of the teachings described in reference to FIGS. 1~3 are equally applicable to such more practical and complex situations.

Although the various aspects of the present invention have been described with respect to a preferred embodiment, it will be understood that the invention is entitled to full protection within the full scope of the appended claims.

We claim:

1. A method for determining fault sources for device failures, comprising:

generating a failure signature of each of a plurality of fault sources detected by each of a plurality of preselected tests;

generating an aggregate of failure signatures for each of said plurality of fault sources from said failure signature from each of said plurality of preselected tests for a particular fault source;

generating test data for a device for each of said plurality of preselected tests;

generating aggregate device test data from said test data of a device for each of said plurality of preselected tests;

generating aggregate matches by comparing said aggregate of failure signatures for each of said plurality of fault sources with said aggregate device test data; and determining fault sources for device failures by comparing said test data of said device with ones of said failure signatures of fault sources corresponding to said aggregate matches.

2. The method according to claim 1, wherein said step of generating failure signatures of fault sources for one of said plurality of preselected tests, comprises:

determining each potential defect failure by analyzing a physical layout of said device; and determining a failure signature for each of said plurality of preselected tests corresponding to each said potential defect source.

3. The method according to claim 1, wherein said generating said aggregate failure signatures for each of said plurality of fault sources from said failure signatures, comprises logically combining failure signatures for each of said plurality of fault source for each of said plurality of preselected tests.

4. The method according to claim 3, wherein said logically combining failure signatures, comprises logically OR'ing failure signatures corresponding each of said plurality of fault source from each of said plurality of preselected tests.

5. The method according to claim 4, wherein said logically OR'ing failure signatures, comprises logically OR'ing bitmap patterns defining each of said failure signatures corresponding to each of said plurality of fault source for each of said plurality of preselected tests by centering said bitmap patterns with respect to each other before said logically OR'ing.

6. The method according to claim 1, wherein said generating aggregate device test data from test data of a device for said plurality of preselected tests, comprises logically combining device test data resulting from conducting each of said plurality of preselected tests on said device.

7. The method according to claim 6, wherein said logically combining device test data resulting from conducting said each of said plurality of preselected tests on said device, comprises logically OR'ing said device test data.

8. The method according to claim 7, wherein said logically OR'ing said device test data, comprises logically OR'ing bitmap patterns of said device test data.

9. The method according to claim 1, wherein said generating aggregate matches by comparing said aggregate failure signatures with said aggregate device test data, comprises searching said aggregate device test data for each of said aggregate failure signatures.

10. The method according to claim 1, wherein said determining fault sources for device failures by comparing said test data of said device with ones of said failure signatures of fault sources corresponding to said aggregate matches, comprises:

determining a set of fault sources corresponding to each of said aggregate matches;

for individual of said set of fault sources, comparing test data of said device for individual of said preselected tests against failure signatures of said set of fault sources for said individual of said preselected tests; and determining said fault sources for said device failures by finding matches through said comparing of said test data against said failure signatures.

11. An apparatus for determining fault sources for device failures, comprising:

means for generating a failure signature of each of a plurality of fault sources detected by each of a plurality of preselected tests;

means for generating an aggregate of failure signatures for each of said plurality of fault sources from said failure signature from each of said plurality of preselected tests for a particular fault source;

means for enerating test data for a device for each of said plurality of preselected tests;

means for generating aggregate device test data from said test data of a device for each of said plurality of preselected tests;

mean for generating aggregate matches by comparing said aggregate of failure signatures for each of said plurality of fault sources with said aggregate device test data; and means for determining fault sources for device failures by comparing said test data of said device with ones of said failure signatures of fault sources corresponding to said aggregate matches.

* * * * *